United States Patent [19]

Nishizawa

[11] Patent Number: 4,629,901
[45] Date of Patent: Dec. 16, 1986

[54] PHOTO COUPLER WITH STATIC INDUCTION TRANSISTOR TYPE DETECTOR

[75] Inventor: Jun-ichi Nishizawa, Sendai, Japan

[73] Assignee: Semiconductor Research Foundation, Japan

[21] Appl. No.: 519,779

[22] PCT Filed: Nov. 30, 1982

[86] PCT No.: PCT/JP82/00456

§ 371 Date: Jul. 29, 1983

§ 102(e) Date: Jul. 29, 1983

[87] PCT Pub. No.: WO83/02039

PCT Pub. Date: Jun. 9, 1983

[30] Foreign Application Priority Data

Nov. 30, 1981 [JP] Japan .................. 56-192415

[51] Int. Cl.⁴ .................................... G02B 27/00
[52] U.S. Cl. ........................... 250/551; 455/602
[58] Field of Search ............ 250/551, 211 J; 357/19, 357/22, 30; 307/311; 455/610, 606, 612, 613, 619, 602

[56] References Cited

U.S. PATENT DOCUMENTS

| | | | |
|---|---|---|---|
| 3,801,837 | 4/1974 | Pease et al. | 250/551 |
| 3,845,318 | 10/1974 | Thillays | 357/19 |
| 3,868,719 | 2/1975 | Arai | 357/22 |
| 3,894,295 | 7/1975 | Shannon et al. | 357/19 |
| 4,100,422 | 7/1978 | Thillays | 250/551 |
| 4,122,479 | 10/1978 | Sugawara et al. | 250/551 |
| 4,227,098 | 10/1980 | Brown et al. | 250/551 |
| 4,368,385 | 1/1983 | Kanbe et al. | 250/551 |
| 4,369,371 | 1/1983 | Hara et al. | 250/551 |
| 4,378,629 | 4/1983 | Bozler et al. | 357/22 |

FOREIGN PATENT DOCUMENTS 54-49085 4/1979 Japan .
54-26876 9/1979 Japan .

OTHER PUBLICATIONS

G. Krause, "Opto–Couplers Used to Provide DC Power for Control of Thyristors", Sep. 1976, *Elektronik*, vol. 25, No. 9, p. 72.

*Primary Examiner*—David C. Nelms
*Assistant Examiner*—Michael Messinger
*Attorney, Agent, or Firm*—McGlew and Tuttle

[57] ABSTRACT

The present invention has for its object to provide a photo coupler which is operable with high sensitivity, high speed, low voltage and small current. To this end, a photo detector (13, 20, 33), which is coupled with one light emitting element (11, 21, 31) through a light transparent insulator, is formed by any one of a static induction transistor, field effect transistor and a static induction transistor.

9 Claims, 9 Drawing Figures

PHOTO COUPLER WITH STATIC INDUCTION TRANSISTOR TYPE DETECTOR

TECHNICAL FIELD

The present invention relates to a photo coupler and, more particularly, to improvement in its photo detector.

TECHNICAL BACKGROUND

A p-i-n diode, an avalanche photo diode and a photo transistor, such as a bipolar transistor, which are employed as photo detectors in conventional photo couplers posses many defects.

The p-i-n diode and the avalanche photo diode are two-terminal elements, and hence have the drawback that they have no function of isolation from the next-stage element. The p-i-n diode and the avalanche photo diode are supplied with a relatively high voltage for operation by irradiating their depletion layers with light. The avalanche photo diode has the serious shortcoming of producing much noise which is due to light that results in an avalanche multiplication.

The photo transistor using a bipolar transistor has a gain as small as 100 or so and has a large base resistance, and hence it possessses the defect of very low-speed operation.

FIGS. 1A and 1B show examples of the arrangements of conventional photo couplers.

FIG. 1A illustrates a photo coupler which employs a GaAs light emitting diode 1 as a light emitting element and a p-i-n diode 2 as a photo detector.

Reference numeral 3 indicates a packaging case in which the light emitting diode 1 and the p-i-n photo diode are housed. There are times when the photo detector 2 is an avalanche photo diode. In operation, an input signal $I_1$ flows in the light emitting diode 1 to generate light $h\nu$ and a current $I_2$ flows in the p-i-n photo diode 2, developing an output signal across a load resistor $R_L$. This arrangement is defective in that a relatively large bias source is needed and in that a special consideration must be paid to its coupling with a circuit of the next stage.

FIG. 1B shows a conventional photo coupler using a bipolar transistor 4 as the photo detector. The light $h\nu$ from the light emitting diode 1 is amplified by the bipolar photo transistor with its base floating. The bipolar transistor has a large base resistance and has the defect that the operating speed is low.

As described above, the conventional photo couplers posess serious drawbacks in practical use.

SUMMARY OF THE INVENTION

An object of the present invention is to provide a photo coupler which employs a static induction transistor, static induction thyristor or field effect transistor as the photo detector to permit operation with such high sensitivity, high speed, low voltage and low current as have been unobtainable in the past.

The photo coupler of the present invention has a portion having connected thereto a static induction transistor, or static induction thyristor coupled with one light emitting element through a light transparent insulator and has the advantages that it operates with very high sensitivity, high speed, low voltage and low current and permits simplification of circuit structures following the photo detector; therefore, the photo coupler of the present invention has a great industrial value.

PREFERRED EMBODIMENTS OF THE INVENTION

Figure 1A:
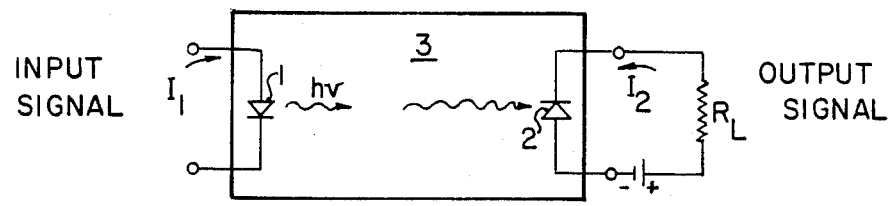
FIG. 1A is a diagram showing the arrangement of a conventional photo coupler using a two-terminal diode as the photo detector.
Figure 1B:
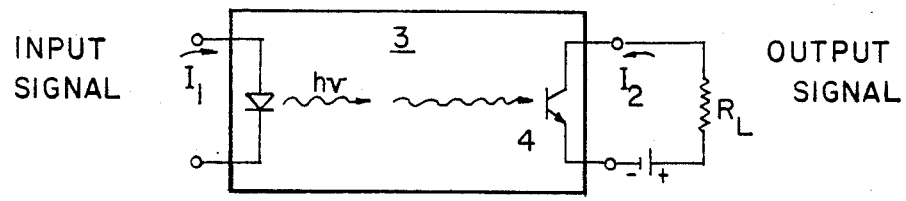
FIG. 1B is a diagram showing the arrangement of another conventional photo coupler employing a bipolar transistor as a photo transistor serving as the photo detector.
Figure 2A:
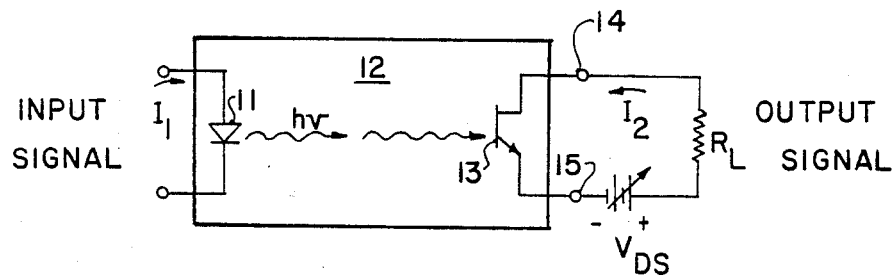
FIGS. 2A through 2C are diagrams illustrating the arrangement of an embodiment of the photo coupler of the present invention which employs a static induction transistor as the photo detector.
Figure 2B:
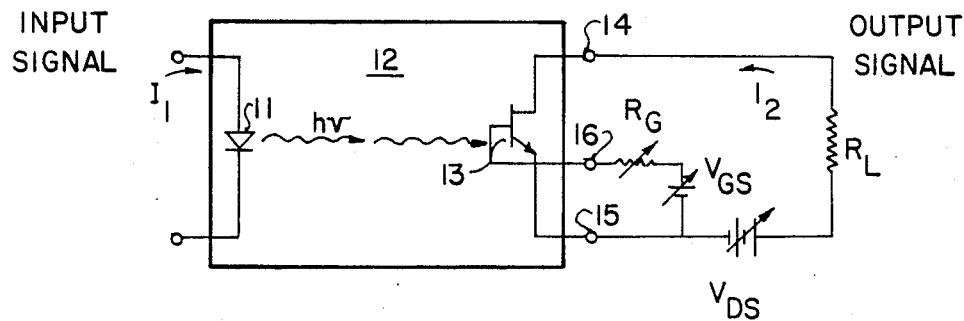
Figure 2C:
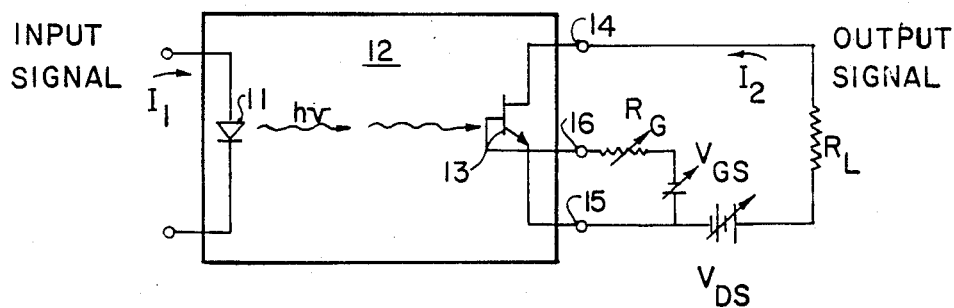

FIGS. 2A through 2C illustrate an embodiment of the photo coupler of the present invention. Reference numeral 11 indicates a light emitting diode or laser diode which emits a signal light; 13 indicates an n-channel static induction transistor or field effect transistor used as the photo detector; and 14, 15 and 16 denote drain, source and gate electrodes, respectively. $V_{DS}$ and $V_{GS}$ are drain-source and gate-source voltage sources, respectively, and $R_L$ is a load resistor. And $R_G$ is a gate resistor which is connected to the gate and variable from zero. Reference numeral 12 indicates a packaging case for shielding the photo coupler from external light. FIGS. 2A to 2C show examples of operation in the cases where the gate-source path of the static induction transistor serving as the photo detector is set in floating-gate (FIG. 2A), forward-biased (FIG. 2B) and reverse-biased (FIG. 2C) conditions, respectively. By changing the gate spacing, the gate thickness and the impurity density of the channel, the static induction transistor can be fabricated as the normally ON type having such an I-V characteristic that permits flowing of much current when the gate voltage is zero but that blocks the current flow when the gate voltage is a reverse bias. The static induction transistor can also be the normally OFF type having such an I-V characteristic that inhibits current flow when the gate voltage is zero but allows flowing of much current when the gate voltage is a forward bias. In FIGS. 2A to 2C an n-channel static induction transistor is used and, in the case of a p-channel static induction transistor, the polarity of the power source is inverted.

The mechanism for amplifying light by the static induction transistor is as follows: In the case of the floating gate, light illuminates the channel to create electron-hole pairs and the holes, which are minority carriers, are drawn to the gate to charge it positive, by which the gate-source potential is lowered to permit flowing of drain current, producing an output voltage Vout across the load resistor $R_L$. In the case of the forward bias, electron-hole pairs are generated by light applied to the channel to cause current flow between the gate and the source, by which the potential of the channel region (an intrinsic gate region) between the gates is lowered to permit flowing of electrons from the source to the drain, producing the output voltage Vout across the load resistor $R_L$. In the case of the reverse bias, the holes of electron-hole pairs created by light applied to the channel, which are minority carriers, are drawn to the gate of negative potential to cause current flow between the gate and the source, by which a voltage drop is produced across the gate resistor $R_G$ to reduce the gate bias, permitting flowing of much current from the source to the drain to develop the output voltage across the load resistor $R_L$.

By employing the static induction transistor as the photo transistor as shown in FIGS. 2A through 2C, a very high-speed and high-sensitivity photo coupler can be obtained because the base resistance of the static induction transistor is not so high as in the case of the bipolar transistor.

While in the above the static induction transistor is described to be the junction gate type, it may also be the MIS gate type. Also it is a matter of course that the static induction transistor may be of the buried gate, surface gate or recessed gate structure. In the case of silicon, the impurity densities of the gate, source and drain, are selected to be approximately $10^{18}$ to $10^{21}$ cm$^{-3}$, and the impurity density of the channel is lower than $1 \times 10^{16}$ cm$^{-3}$ or so.

The SIT inherently has an unsaturable current-voltage characteristic following the exponential function law with respect to the gate voltage and the drain-source voltage. An SIT is designed so that its channel length is short, the channel being substantially depleted, and the potential barrier height in the channel varying with gate potential and the source-drain voltage.

As a result of measurement of the static induction transistor of the surface gate structure in accordance with the embodiments of FIGS. 2A to 2C, an amplification factor above $10^3$ was obtained; hence it was found that the photo coupler of the present invention is sufficiently larger in optical gain than the conventional photo couplers.

Figure 3:
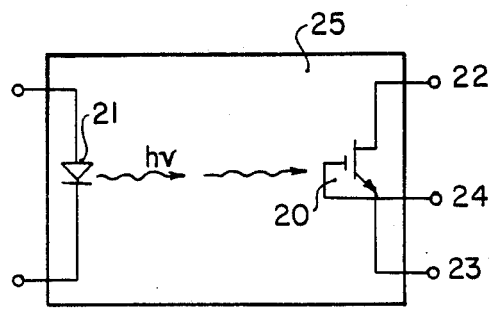
FIG. 3 is a diagram illustrating another emobdiment of the photo coupler of the present invention which uses, as the photo detector, a static induction transistor having an MIS gate.

FIG. 3 illustrates another embodiment of the present invention, which is a photo coupler using, as the photo detector, a static induction transistor of the MIS gate structure rather than of the junction gate type.

Reference numeral 20 indicates a static induction transistor of MIS gate structure, 21 a light emitting element, for instance, a GaAs light emitting diode, 22, 23 and 24, drain, source and gate electrodes, respectively. Reference numeral 25 denotes a packaging case for shielding the light emitting element 21 and the photo detector 20 from external light. This photo coupler is substantially identical in operation with those of FIGS. 2A to 2C.

Figure 4A:
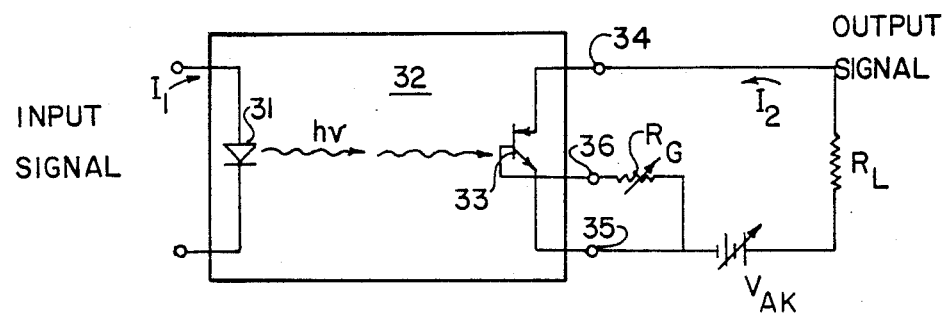
FIGS. 4A and 4B are diagrams illustrating the arrangement of another embodiment of the photo coupler of the present invention which employs a static induction thyristor as the photo detector.
Figure 4B:
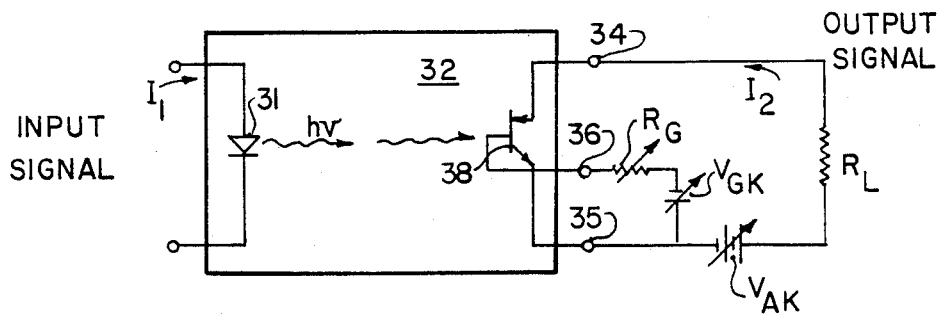

FIGS. 4A and 4B illustrate another embodiment of the present invention which employs a static induction thyristor as the photo detector.

FIG. 4A shows a photo coupler which comprises a normally OFF type static induction thyristor 33, a light emitting element 31 and a packaging case 32 for shielding light. Reference numeral 34 indicates an anode, 35 a cathode and 36 a gate terminal. A power source $V_{AK}$ and a load resistor $R_L$ are connected between the anode and the cathode, and a gate resistor $R_G$ is connected between the gate and cathode. When no light is applied, no current flows in the thyristor 33 since it is normally OFF. When light is applied, current flows from the gate to the cathode to cause a voltage drop across the gate resistor $R_G$, by which the gate-cathode path is conducted to permit a large current flow from the anode to the cathode, producing an output signal in the load resistor $R_L$. Next, when the illumination by light is stopped, carriers stored between the gate and the cathode are gradually discharged through the gate resistor $R_G$, by which the gate-cathode path is returned to its initial state, cutting off the current.

FIG. 4B shows an arrangement in which a reverse bias source $V_{GK}$ is connected between the gate and the cathode so as to quickly cut off the current flow. This is a photo coupler which is identical in construction with that of FIG. 4A except that 38 is a normally ON or normally OFF type n-channel static induction thyristor.

In the case of the normally ON type static induction thyristor, a gate-cathode voltage is applied which provides a desired blocking voltage. This type of static induction thyristor is turned ON in the same manner as in the case of FIG. 4A but it has the advantage that when irradiation by light is stopped, it is turned OFF in a shorter time than that needed in the embodiment of FIG. 4A since the reverse voltage is applied between the gate and the cathode. As compared with the conventional p-n-p-n thyristor which cannot be turned OFF through the gate, the static induction thyristor is advantageous in that it can be completely turned OFF through the gate, that the turning-ON voltage is small, and that the switching time can be reduced to less than 1 $\mu$sec to permit very high-efficiency switching; therefore, it is a great value when employed in a high-power photo coupler.

Figure 5:
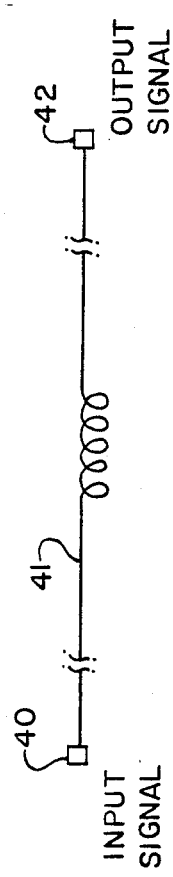
FIG. 5 is a diagram illustrating the arrangement of another embodiment of the present invention which uses an optical fiber as a light transmission path.

FIG. 5 illustrates a photo coupler in which the light emitting element and a static induction transistor, or static induction thyristor used as the photo detector are interconnected by an optical fiber.

Reference numeral 40 indicates a light emitting element, for example, a light emitting diode or laser diode, 41 an optical fiber of an arbitrary length and 42 a static induction transistor or static induction thyristor. The static induction transistor 42 is connected to a power source and a load resistor as in the FIGS. 2A to 4B embodiments of the present invention. Light emitted from the light emitting element 40 in response to an input signal is propagated in the optical fiber and amplified by the static induction transistor or static induction thyristor 42 to obtain an output signal. By using the optical fiber as the transmission line for the light from the light emitting element 40, it is possible to obtain a high-speed photo coupler of very good SN ratio for signal transmission from a remote place.

It is a matter of course that the static induction transistor or static induction thyristor used as the photo detector is not limited specifically to silicon but may also be of other semiconductors and that it may be not only n-channel but also p-channel one.

The packaging case may also be one that is packed with resin or the like to such an extent as not to attenuate light to provide for increased airtightness and durability.

I claim:

1. A photocoupler comprising a light-emitting element, a static induction transistor forming a photodetector for detecting light from the light-emitting element, an insulating material between said light-emitting element and said static induction transistor which permits passage therethough of light from the light-emitting element to the static induction transistor, and a unitary package for housing the light-emitting element, the static induction transistor and the insulating material as a unitary structure, the static induction transistor having a source, a drain and a gate and exhibiting an unsaturable current-voltage characteristic following the exponential function law with respect to a gate potential and a drain-source voltage thereof, the static induction transistor having a channel with a short channel length and being substantially depleted, a potential barrier height in the channel varying with the gate potential and the drain-source voltage.

2. A photocoupler according to claim 1, wherein said static induction transistor is of the normally off type, and including means for holding said gate open until light is received from said light-emitting element.

3. A photocoupler according to claim 1, wherein said static induction transistor is of the normally off type, a variable gate resistor connected to said gate and operable for adjusting photosensitivity of said static induction transistor, and a variable forward bias induction voltage supply, said voltage supply being connected in series with said gate resistor and across said gate and source of said static induction transistor.

4. A photocoupler according to claim 3 wherein the static induction transistor is made of silicon, the impurity densities of the gate, source and drain being selected to be approximately $10^{18}$ to $10^{21}$ cm$^{-3}$, and the impurity density of the channel is lower than $10^{16}$ cm$^{-3}$.

5. A photodetector according to claim 1, wherein said static induction transistor is of the normally on type, a variable gate resistor connected to said gate for adjusting photosensitivity of said static induction transistor, and a variable reverse gate bias voltage source connected in series across said gate and source of said static induction transistor.

6. A photocoupler according to claim 5 wherein the static induction transistor is made of silicon, the impurity densities of the gate, source and drain being selected to be approximately $10^{18}$ to $10^{21}$ cm$^{-3}$, and the impurity density of the channel is lower than $10^{16}$ cm$^{-3}$.

7. A photocoupler according to claim 1 wherein the static induction transistor is made of silicon, the impurity densities of the gate, source and drain being selected to be approximately $10^{18}$ to $10^{21}$ cm$^{-3}$, and the impurity density of the channel is lower than $10^{16}$ cm$^{-3}$.

8. A photocoupler comprising a light-emitting element, a normally off type static induction thyristor forming a photodetector for detecting light from said light-emitting element, a package for enclosing said light-emitting element and said static induction thyristor, an insulating material in said package between said light-emitting element and said thyristor and through which light from said light-emitting element passes, said package forming a unitary structure with said light-emitting element, said thyristor and said insulating material therein, said thyristor including a gate, an anode and a cathode, and a variable gate resistor for photosensitivity adjustment connected between said gate and said cathode of said thyristor.

9. A photocoupler comprising a light-emitting element, a normally on type static induction thyristor forming a photodetector for light from said light-emitting element, an insulating material which permits the passage of light therethrough disposed between said light-emitting element and said thyristor for passage of light from said light-emitting element to said thyristor, a unitary package structure containing said light-emitting element, said insulating material and said thyristor and forming a unitary structure therewith, said thyristor including a gate, a cathode and an anode, a variable gate resistor connected to said gate for photosensitivity adjustment, and a reverse gate bias voltage source connected in series across said gate and cathode of said static induction thyristor.

* * * * *